(12) United States Patent
Hayakawa

(10) Patent No.: US 6,184,722 B1
(45) Date of Patent: Feb. 6, 2001

(54) LATCH-TYPE SENSE AMPLIFIER FOR AMPLIFYING LOW LEVEL DIFFERENTIAL INPUT SIGNALS

(75) Inventor: Shigeyuki Hayakawa, San Jose, CA (US)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 09/146,203

(22) Filed: Sep. 2, 1998

(51) Int. Cl.$^7$ .............................. G01R 19/00; C11C 7/00; H03F 3/45
(52) U.S. Cl. ............................................. 327/55; 365/205
(58) Field of Search .................................. 327/51, 52, 55, 327/57; 365/205, 207, 208

(56) References Cited

U.S. PATENT DOCUMENTS

| | | | |
|---|---|---|---|
| 4,523,110 | * 6/1985 | Johnson | 327/52 |
| 4,910,713 | 3/1990 | Madden et al. | 365/189 |
| 4,973,864 | 11/1990 | Nogami | 307/530 |
| 5,192,878 | 3/1993 | Miyamoto et al. | 307/362 |
| 5,253,137 | * 10/1993 | Seevinck | 365/230.01 |
| 5,384,733 | 1/1995 | Sueoka et al. | 365/189.01 |
| 5,386,379 | 1/1995 | Ali-Yahia et al. | 365/49 |
| 5,408,437 | 4/1995 | Cho et al. | 365/203 |
| 5,506,524 | 4/1996 | Lin | 327/57 |
| 5,534,800 | 7/1996 | Hiraki et al. | 327/57 |
| 5,563,533 | 10/1996 | Cave et al. | 327/67 |
| 5,585,747 | 12/1996 | Proebsting | 327/55 |
| 5,604,705 | 2/1997 | Ackland et al. | 365/205 |
| 5,680,356 | * 10/1997 | Yamauchi | 365/205 |

* cited by examiner

Primary Examiner—Terry D. Cunningham
Assistant Examiner—Anh-Qua Tra
(74) Attorney, Agent, or Firm—Limbach & Limbach L.L.P.

(57) ABSTRACT

A latch-type sense amplifier receives a low level differential small swing input signal pair. The amplifier includes a pair of MOSFET switches of a first conductivity type each having a first source/drain terminal coupled to one of the input signal lines. The latch has a second pair of MOSFETs of the first conductivity type with its first source/drain terminal connected to the second source/drain terminal of one of the first pair of MOSFETs. Each of the second pair of MOSFETs has its first source/drain terminal connected to the first source/drain terminal of a third pair of MOSFETs of the second conductivity type. Each MOSFET of the second conductivity type has its second source/drain terminal connected to a first voltage source. The gate terminals of the second pair of MOSFETs are connected together to receive a control signal. The gate terminals of each of the third pair of MOSFETs are cross-coupled and connected to the second source/drain terminals of the first pair of MOSFETs. Each of two outputs is defined at the second source/drain terminal of one of the first pair of MOSFETs. In this way, one output switches from high level to low level and the other remains at high level, when the input signal pair reaches a small threshold differential. The latch-type sense amplifier thus senses and amplifies a low level differential small swing input signal.

31 Claims, 7 Drawing Sheets

LATCH-TYPE SENSE AMPLIFIER FOR AMPLIFYING LOW LEVEL DIFFERENTIAL INPUT SIGNALS

TECHNICAL FIELD

The present invention relates to a latch-type sense amplifier and, in particular, to a latch-type high-speed sense amplifier having a low level differential small-swing input pair.

DESCRIPTION OF THE RELATED ART

Figure 1:
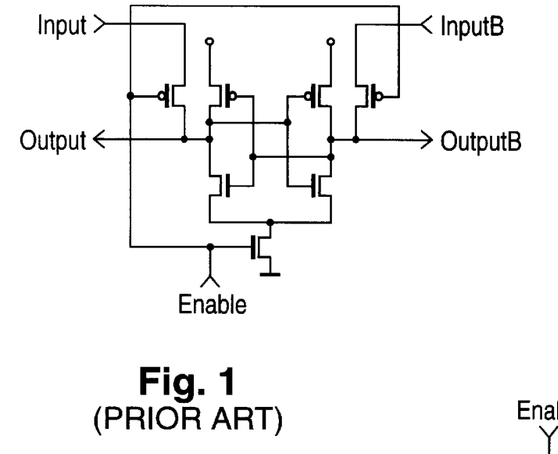
FIG. 1 is a schematic diagram of a first sense amplifier of the prior art.

Referring to FIG. 1, a first sense amplifier of the prior art receives an input pair signal which is high, i.e., around the supply voltage. This amplifier has output signals pre-charged to the high input signal level. Each input signal line is connected to a source/drain of a p-channel MOSFET (PMOS). A significant limitation is that it cannot amplify low level small differential signals, and is not therefore useful for applications requiring low level small differential amplification. Moreover, this prior art sense amplifier cannot have multiple shared inputs to the same latch.

Figure 2:
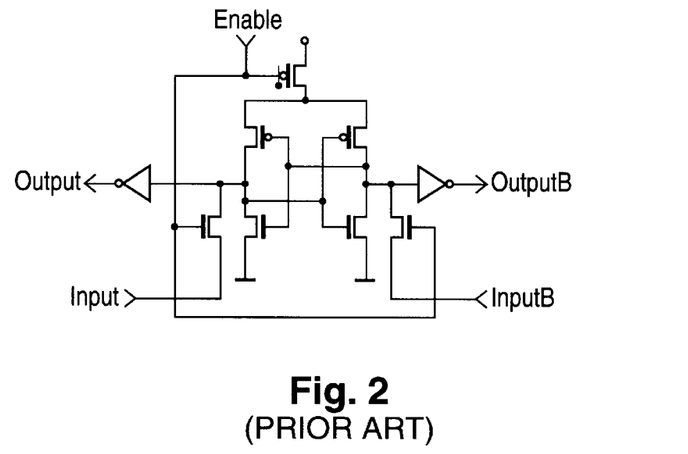
FIG. 2 is a schematic diagram of a second sense amplifier of the prior art.

Referring to FIG. 2, a second sense amplifier of the prior art receives an input pair signal which is low, i.e., around ground level and pre-charged to the input signal level. The problem with it is that it is undesirably slow, even compared with the sense amplifier of FIG. 1. A reason this second prior art sense amplifier is slow is that each output of its output pair is connected with a source/drain terminal of a PMOS transistor. This difference is significant because PMOS a PMOS transistor. This difference is significant because PMOS transistors have less drivability than n-channel MOS-FETs (NMOS) do, and cause the amplifier to be slow. This second prior art sense amplifier further differs because respective source/drain terminals of the noted PMOS transistors are connected to source/drain terminals of NMOS transistors whose other drain/source terminals are each connected to an input of the input pair of the amplifier.

Another reason that the second prior art sense amplifier is slow is that it has an increased sensing delay due to two inverters. These inverters, which are added to obtain high pre-charged output signals, are each connected between an output and a source/drain terminal of one of the two NMOS transistors whose sources/drains are connected to inputs. Yet another problem with the second prior art sense amplifier is that it cannot receive multiple shared inputs to the same latch.

Figure 3:
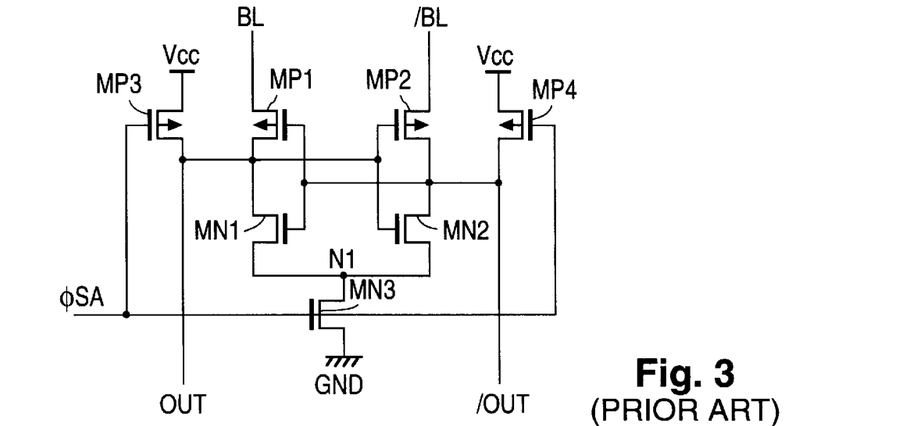
FIG. 3 is a schematic diagram of a third sense amplifier of the prior art.

Referring to FIG. 3, a third sense amplifier of the prior art is disclosed in U.S. Pat. No. 5,534,800 to Hiraki et al. The Hiraki amplifier has a similar functionality as the first prior art amplifier shown in FIG. 1, wherein it functions to sense and amplify high level low differential input signals, and not low level signals. The Hiraki sense amplifier has a first pair of PMOS transistors, each with a source/drain terminal connected to an input. These PMOS transistors turn off during pre-charge, such that no data flows into the latch of the sense amplifier during pre-charge. The sense amplifier has a second pair of PMOS transistors which turn off when the sense amplifier is enabled. Further, the amplifier has two NMOS transistors, each connected to a drain/source terminal of one of the first pair of PMOS, which are pulled down after the sense amplifier is enabled and each of the second pair of PMOS turn off. Only after that is data received by each of the first pair of PMOS transistors of the latch. Thus, an undesirable time delay occurs during the operation of the Hiraki sense amplifier because the first pair of PMOS transistors turn off during pre-charge, and data enters through the second pair of PMOS transistors only after the NMOS transistors are pulled down.

Figure 4:
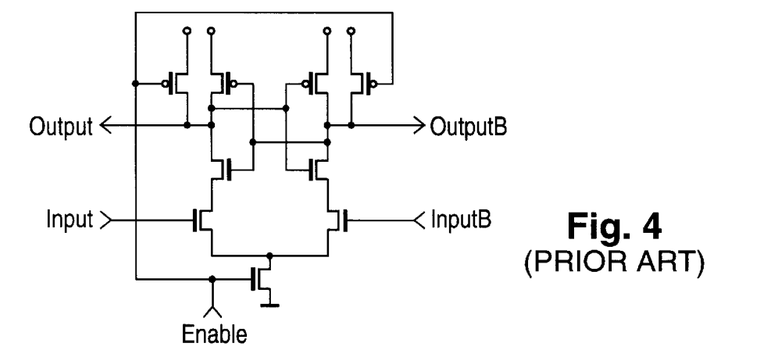
FIG. 4 is a schematic diagram of a fourth sense amplifier of the prior art.

Referring to FIG. 4, a fourth sense amplifier of the prior art is shown. This sense amplifier differs from the other prior art sense amplifiers noted above because each input is connected to a gate terminal of an NMOS transistor, rather than a source/drain terminal. This fourth prior art sense amplifier has applicability for amplifying high-level differential small-swing input pairs. It is not, however, satisfactory for use with low-level input pairs. This is because the low level inputs to the gates of each NMOS cause the NMOS to be off, rather than on, as would result from high level inputs to the gates of the NMOS.

SUMMARY OF THE INVENTION

The present invention solves the aforementioned problems in the prior art by providing a sense amplifier that can sense low level differential input quickly. The present invention provides a sense amplifier that can amplify low level differential small swing input signals.

Furthermore, the present invention provides a sense amplifier which is advantageously fast because each one of a pair of outputs is connected with a source/drain terminal of an NMOS transistor, wherein the NMOS has greater drivability than a typical PMOS.

In addition, the present invention can provide multiple shared inputs to the sense amplifier. A sense amplifier capable of having multiple inputs is a desired feature of plural embodiments of the present invention not shared by prior art amplifiers.

Another advantage of the present invention is realized wherein a first output switches from high level to low level and a second output remains at high level, when a low level differential small swing input signal pair reaches a threshold differential and thus a low level small swing input signal is sensed and amplified.

To achieve these desirable features and advantages, a latch-type sense amplifier of the present invention has a pair of input signal lines for receiving a pair of input signals forming a differential input signal pair. A pair of transistors of a first conductivity type each has a first and a third spaced apart terminals and a second terminal for controlling the flow of current between the first and third terminals. The first terminal of each transistor of the pair is connected to one of the input signal lines for receiving one of the input signals. The third terminal of each transistor of the pair is connected to the second terminal of the other transistor, forming one output of an output pair for supplying an output signal and its inverse. A pair of switching circuits controls the connection/disconnection between a voltage source and each of the third terminals of the transistor pair. The first output switches from high to low level and the second output remains at high level when the input signal pair reaches a threshold differential.

DETAILED DESCRIPTION OF THE PREFERRED EMBODIMENTS

Figure 5A:
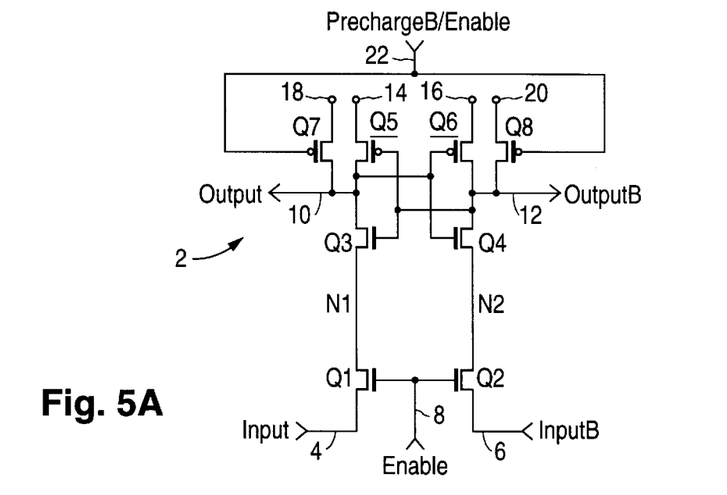
FIG. 5A is a schematic diagram of a sense amplifier according to a first embodiment of the present invention.
Figure 5B:
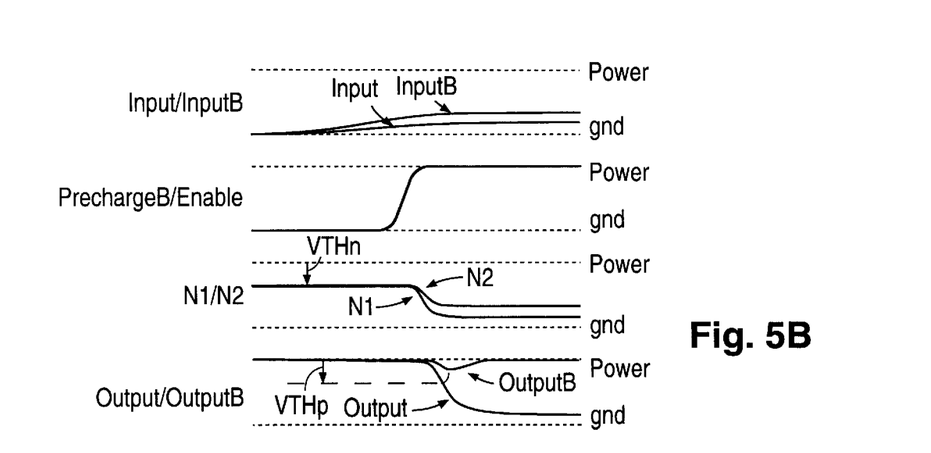
FIG. 5B is a graph showing potentials of various signals at various points in the circuit of FIG. 5A as a function of time.

Referring to FIG. 5A, a latch-type sense amplifier 2 according to a first embodiment of the present invention comprises a first input signal line 4 and a second input signal line 6. The first input signal line 4 and the second input signal line 6 receive a low-level differential small swing input signal pair. A different input potential is applied to each of the input signal lines 4,6. As seen in FIG. 5B, the different input potentials are each low relative to a power source voltage at all relevant times. The difference between the two input potentials is also low relative to the power source voltage at all relevant times. Both the two input potentials and the potential difference between them increase gradually from zero after time zero.

Again referring to FIG. 5A, multiple MOSFETs are connected into the circuit of the preferred embodiment. At least some of these MOSFETs could be replaced by other devices such as bipolar junction transistors without detracting from the spirit of the invention. For example, when the function of a transistor of the circuit is to switch on and off, multiple conventional switching devices may be substitutable in its place.

Each MOSFET of the preferred embodiment has a channel comprising either n-type or p-type silicon. The conductivity-type attributions of each MOSFET of the preferred first embodiment could be reversed along with the time dependence of the enabling signal voltages to achieve a different embodiment similar, but not identical, to the first. This different embodiment would be within the scope of the present invention.

Each channel of each MOSFET of the preferred embodiment separates a first source/drain terminal from a second source/drain terminal of the MOSFET. Each MOSFET has a gate terminal for controlling the flow of current between its source/drain terminals.

The amplifier 2 further comprises a first n-channel MOSFET (NMOS) Q1 having a first source/drain terminal connected to the first input 4, and a second NMOS transistor Q2 having a first source/drain terminal connected to the second input 6. Each of the first NMOS Q1 and the second NMOS Q2 has a gate terminal connected to a first enabling signal line 8 for receiving a control signal. FIG. 5B shows that at time zero, the enabling signal is at ground potential. Therefore, at time zero, the first NMOS Q1 and the second NMOS Q2 are switched off such that no appreciable current flows across their terminals, at relevant voltages.

Again referring to FIG. 5A, a third NMOS transistor Q3 has a first source/drain terminal connected to a second source/drain terminal of the first NMOS Q1. Also, a fourth NMOS transistor Q4 has a first source/drain terminal connected to a second source/drain terminal of the second NMOS Q2. A first output 10 is connected both to a second source/drain terminal of the third NMOS Q3 and to a gate terminal of the fourth NMOS Q4. A second output 12 is connected both to a second source/drain terminal of the fourth NMOS Q4 and to a gate terminal of the third NMOS Q3.

A first PMOS transistor Q5 has a first source/drain terminal connected to the first output 10 and a gate terminal connected to the second output 12. A second source/drain terminal of the first PMOS Q5 is connected to a first power source 14. A second PMOS transistor Q6 has a first source/drain terminal connected to the second output 12 and a gate terminal connected to the first output 10. A second source/drain terminal of the second PMOS Q6 is connected to a second power source 16. In a preferred embodiment, the first and second power sources 14 and 16 are the same. A second enabling signal line 22 receives the same control signal as that supplied to the first enabling signal line 8.

A third PMOS transistor Q7 has a first source/drain terminal which, like the first PMOS Q5, is connected to the first output 10. However, the third PMOS Q7 has a gate terminal connected to the second enabling signal line 22, and a second source/drain terminal connected to a third power source 18. A fourth PMOS transistor Q8 has a first source/drain terminal which, like the second PMOS Q6, is connected to the second output 12. However, the fourth PMOS Q8 has a gate terminal connected to the second enabling signal line 22, and a second source/drain terminal connected to a fourth power source 20. In the preferred embodiment, the third and fourth power sources 18 and 20 are the same as the power source 14 or 16.

Since the control signal is low at time zero, the third PMOS Q7 and the fourth PMOS Q8 are on at that time. Therefore, both the first output 10 and the second output 12 are pre-charged to the power source voltage minus the PMOS threshold voltage VTHp, as shown in FIG. 5B. With outputs 10 and 12 high, both the third NMOS Q3 and the fourth NMOS Q4 are on at time zero. Therefore, the voltage potential at a first node N1 located between the second source/drain terminal of the first NMOS Q1 and the first source/drain terminal of the third NMOS Q3 is at the power source voltage minus the NMOS threshold voltage VTHn. Likewise, the potential at a second node N2 located between the second source/drain terminal of the second NMOS Q2 and the first source/drain terminal of the fourth NMOS Q4 is at the power source voltage minus VTHn. Also, since the gate terminals of both the first PMOS Q5 and the second PMOS Q6 are connected to high output voltages at time zero, both of these transistors are turned off at that time.

After time zero, the potentials at both the first input 4 and the second input 6 are gradually increased from ground level. Also, one of the inputs has a slightly higher potential than the other at all times greater than time zero. The difference between the potential of the second input 6 and the potential of the first input 4 also gradually increases after time zero.

When the difference between the first input 4 and the second input 6 rises to a predetermined threshold potential difference, the potential at both the first enabling signal line 8 and the second enabling signal line 22 switches from ground potential to a power source potential. In so doing, both the third PMOS Q7 and the fourth PMOS Q8 are switched off. At the same time, both the first NMOS Q1 and the second NMOS Q2 are switched on. Thus, the first output 10 is disconnected from the third power source 18, and the second output 12 is disconnected from the fourth power source 20. Although PMOS Q7 and Q8 are turned off, outputs 10 and 12 remain high. This keeps NMOS Q3 and Q4 turned on. Thus, the first output 10 is connected to the first input 4, and the second output 12 is connected to the second input 6.

The switching of the first NMOS Q1, the second NMOS Q2, the third PMOS Q7 and the fourth PMOS Q8, when the enabling signal lines 8,22 switch from low to high, after the input differential reaches a threshold amount, causes both the first output 10 and the second output 12 to discharge. It also causes the charge stored around both the first node N1 and the second node N2 to discharge. However, if we assume that the potential of the input signal at input line 4 is at a lower potential than the input signal at input line 6, then the first output 10 discharges faster than the second output 12.

After the potential of the first output 10 has fallen below a potential predetermined partly based on the value of VTHp, the second PMOS Q6 switches on. When the second PMOS Q6 switches on, the second output 12 is connected to the second power source 16 and the second output 12 goes back to the power source potential.

The potential of the first output 10 continues to fall until it reaches approximately the potential of the first input 4 to which it is connected. At this time, the first output 10 and the second output 12 reach a steady state in which the potential difference between the first output 10 and the second output 12 is large compared with that between the first input 4 and the second input 6. Moreover, the potential of the second output 12 is large compared with the potential of any of the first input 4, the second input 6 or the first output 10.

Figure 6:
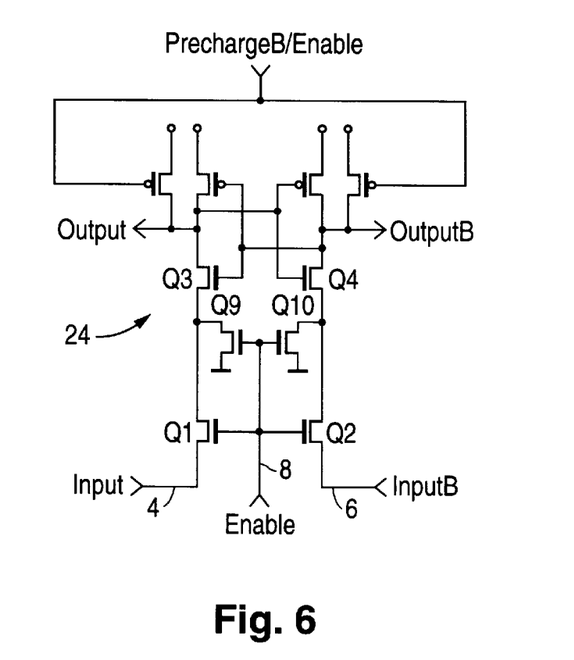
FIG. 6 is a schematic diagram of a latch-type sense amplifier according to a second embodiment of the present invention.

Referring to FIG. 6, a latch-type sense amplifier 24 according to a second embodiment of the present invention, in addition to all of the elements of the amplifier 2 of the first embodiment, comprises a first pull-down NMOS transistor Q9 and a second pull-down NMOS transistor Q10. The first pull-down NMOS Q9 has a second source/drain terminal connected to the first source/drain terminal of the third NMOS Q3. The second pull-down NMOS Q10 has a second source/drain terminal connected to the first source/drain terminal of the fourth NMOS Q4. Each of the first pull-down NMOS Q9 and the second pull-down NMOS Q10 has a gate terminal connected to the first enabling signal line 8 and a first source/drain terminal connected to ground. At time zero, the two pull-down NMOS Q9,Q10 are turned off because the control signal supplied on the enabling line 8 is low. After the control signal goes to high potential, the two pull-down NMOS Q9,Q10 are switched on and they pull-down their respective sides. In this way, when the first pull-down NMOS Q9 and the second pull-down NMOS Q10 are turned on, they pull down faster the side that has a lower input signal 4 supplied thereto. This increases the speed of detecting the differential between the input signal pair.

Figure 7:
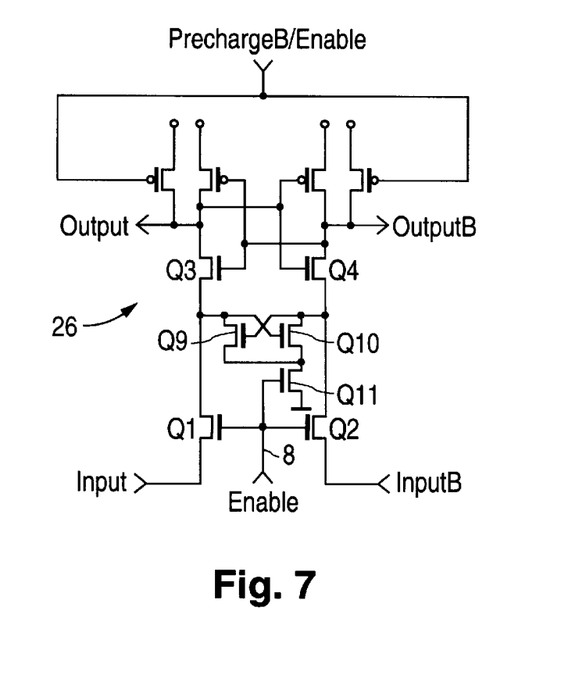
FIG. 7 is a schematic diagram of a sense amplifier according to a third embodiment of the present invention.

Referring to FIG. 7, a latch-type sense amplifier 26 according to a third embodiment of the present invention, in addition to all of the elements of the second embodiment 24, has a coupling NMOS transistor Q11. Also, in contrast with the second embodiment 24, neither the first source/drain terminal of the first pull-down NMOS transistor Q9 nor the first source/drain terminal of the second pull-down NMOS transistor Q10 is connected to ground as in the second embodiment 24 shown in FIG. 6. Instead, each of these first source/drain terminals is connected to a first source/drain terminal of the coupling NMOS Q11. The coupling NMOS Q11 also has a gate terminal connected to the first enabling signal line 8 and a second source/drain terminal connected to ground. In addition, the gate of NMOS Q9 is connected to the second source/drain terminal of NMOS Q10, and the gate of NMOS Q10 is connected to the second source drain terminal of NMOS Q9. In this way, the system including the first pull-down NMOS Q9, the second pull-down NMOS Q10 and the coupling NMOS Q11 is a transistor coupled pull-down mechanism for the latch. In operation, when the control signal is high, transistor Q11 is turned on. This connects the first source/drain terminals of Q9 and Q10 to ground. Because the transistors NMOS Q9 and NMOS Q10 are cross-coupled, however, one side will be turned on harder than the other side, creating a difference faster than the second embodiment 24 wherein a constant potential is supplied to the gates of Q9 and Q10.

Figure 8:
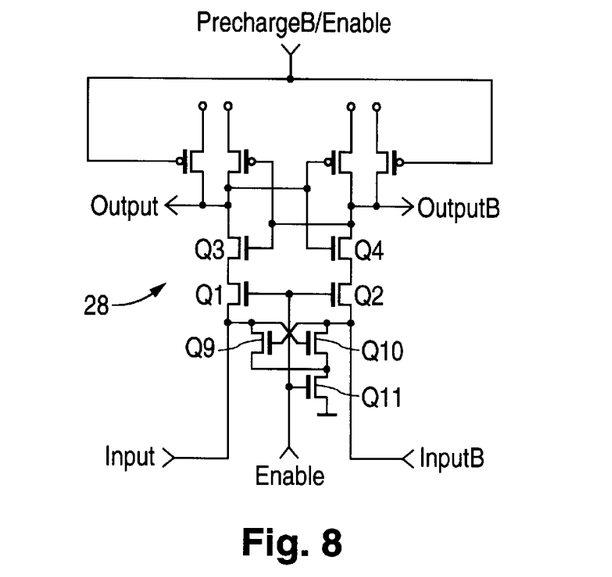
FIG. 8 is a schematic diagram of a sense amplifier according to a fourth embodiment of the present invention.

Referring to FIG. 8, a latch-type sense amplifier 28 according to a fourth embodiment of the present invention comprises all of the elements of the third embodiment 26. However, the elements are connected somewhat differently. The difference is that the second source/drain terminal of the first pull-down NMOS Q9 is connected to the first source/drain terminal of the first NMOS Q1, and not that of the third NMOS Q3, and the second source/drain terminal of the second pull-down NMOS Q10 is connected to the first source/drain terminal of the second NMOS Q2, and not that of the fourth NMOS Q4. In operation, this fourth embodiment 28 operates similar to the third embodiment 26.

Figure 9:
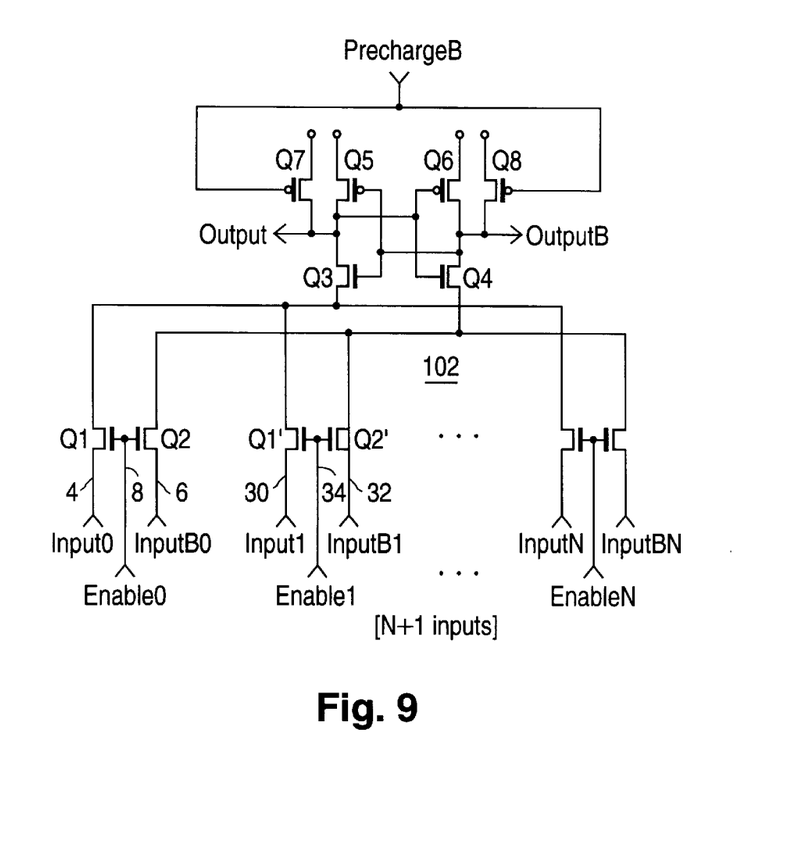
FIG. 9 is a schematic diagram of a sense amplifier according to a fifth embodiment of the present invention.

Referring to FIGS. 9, 10, 11 and 12, each of the four embodiments shown in FIGS. 9–12 is generally one of the first four embodiments shown in FIGS. 5a, 6, 7 and 12, respectively, additionally comprising multiple pairs of input lines connected in parallel. Specifically, FIG. 9 shows a fifth embodiment 102 of the present invention, including all of the elements of the first embodiment, further comprising N pairs of input lines. Each of the pairs of input lines (e.g., 4, 6 and 30, 32) receives a pair of input signals, passing through a pair of NMOS transistors (e.g., Q1, Q2 and Q1' and Q2'), which are controlled by a control signal supplied on enabling lines (e.g., 8 and 34). The pairs of input lines are connected to the first source/drain terminals of Q3 and Q4.

An example of one additional pair of input lines includes a fifth NMOS transistor Q1' and a sixth NMOS transistor Q2'. The fifth NMOS has a first source/drain terminal connected to a third input signal line 30, a gate terminal connected to a third enabling signal line 34 and a second source/drain terminal connected to the first source/drain terminal of the third NMOS Q3. The sixth NMOS Q2' has a first source/drain terminal connected to a fourth input signal line 32, a gate terminal connected to the third enabling signal line 34 and a second source/drain terminal connected to the first source/drain terminal of the fourth NMOS Q4. In this way, the fifth embodiment of the present invention is a latch-type sense amplifier having multiple inputs to a shared latch. In operation, the sense amplifier 102 can sense and latch a first pair of low level differential input signals supplied on input lines 4 and 6 as controlled by the first control signal supplied on enabling line 8, or a second pair of low level differential input signals supplied on input lines 30 and 32 as controlled by a second control signal supplied on enabling line 34.

Figure 10:
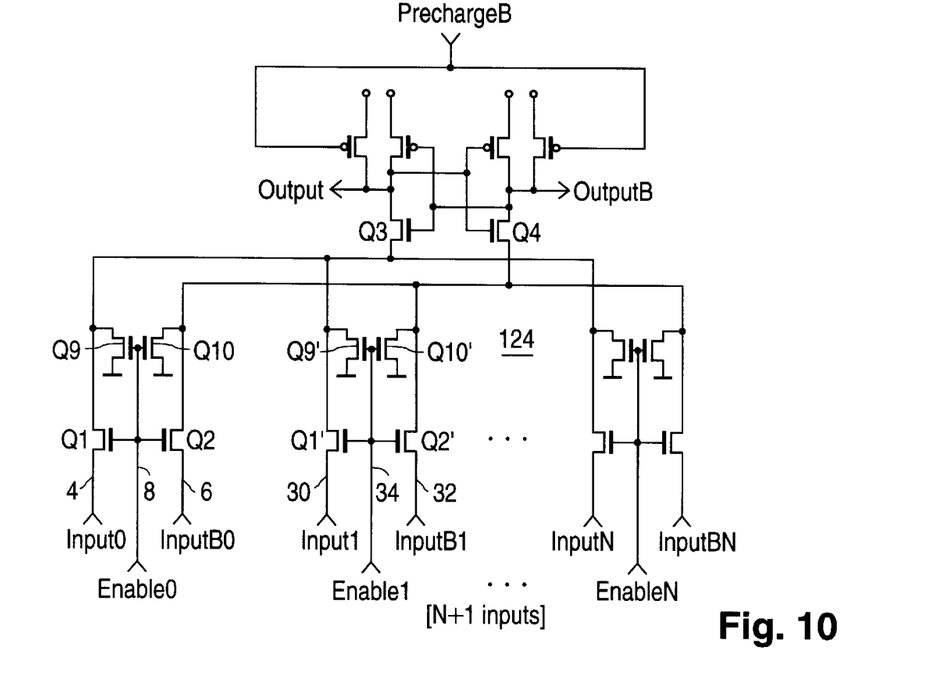
FIG. 10 is a schematic diagram of a sense amplifier according to a sixth embodiment of the present invention.

FIG. 10 shows a sixth embodiment 124, including all of the elements of the second embodiment, further comprising one or more additional pairs of input lines connected in parallel. An example of one additional pair of input lines includes a third pull-down NMOS transistor Q9' and a fourth pull-down NMOS transistor Q10'. The third pull-down NMOS Q9' has a second source/drain terminal connected to the first source/drain terminal of the third NMOS Q3, a gate terminal connected to a third enabling signal line 34, and a first source/drain terminal connected to ground. The fourth pull-down NMOS Q10' has a second source/drain terminal connected to the first source/drain terminal of the fourth NMOS Q4, a gate terminal connected to the third enabling signal line 34, and a first source/drain terminal connected to ground. In this way, the sixth embodiment of the present invention is a latch-type sense amplifier having multiple inputs with pull-down mechanisms to a shared latch.

Figure 11:
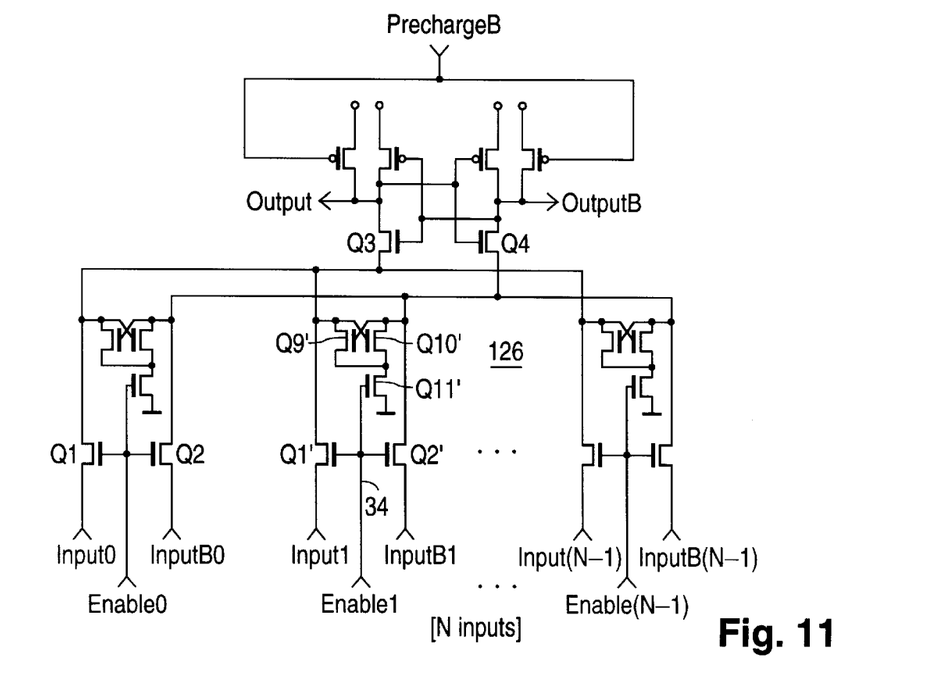
FIG. 11 is a schematic diagram of a sense amplifier according to a seventh embodiment of the present invention.

FIG. 11 shows a seventh embodiment 126, including all of the elements of the third embodiment 26, further comprising one or more additional pairs of input lines connected in parallel. An example of this system with one additional pair of input lines includes the elements of the sixth embodiment 124 and a second coupling NMOS Q11'. Also, in contrast with the sixth embodiment 124 shown in FIG. 10, the seventh embodiment 126 has neither the first source/drain terminal of the third pull-down NMOS Q9' nor the first source/drain terminal of the fourth pull-down NMOS Q10' connected to ground. Instead, both the first source/drain terminal of the third pull-down NMOS Q9' and the first source/drain terminal of the fourth pull-down NMOS Q10' are connected to a second source/drain terminal of the second coupling NMOS Q11'. A gate terminal of the second coupling NMOS Q11' is connected to the third enabling signal line 34 and the first source/drain terminal of the second coupling NMOS Q11' is connected to ground. In this way, the seventh embodiment 126 of the present invention is a latch-type sense amplifier having multiple inputs with transistor coupled pull-down mechanisms to a shared latch.

Figure 12:
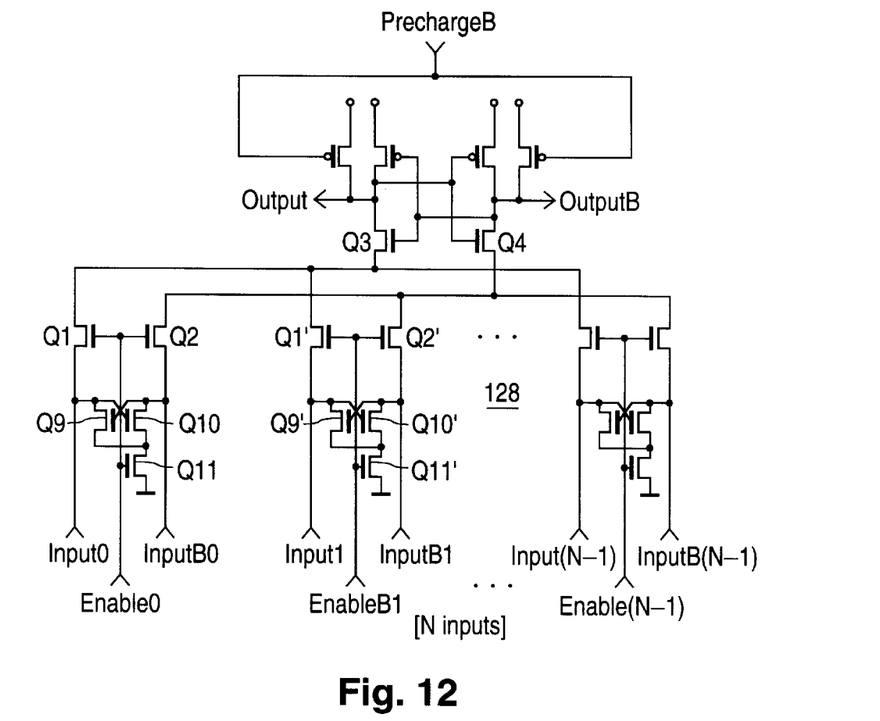
FIG. 12 is a schematic diagram of a sense amplifier according to a eighth embodiment of the present invention.

FIG. 12 shows an eighth embodiment 128, including all of the elements of the fourth embodiment 28, further comprising one or more additional pairs of input lines connected in parallel. An example of this system with one additional pair of input lines includes the elements of the seventh embodiment 126. The difference between the eighth embodiment 128 and the seventh embodiment 126 is that a second source/drain terminal of each of the first and third pull-down NMOS Q9,Q9' is connected to a first source/drain terminal of the first respective NMOS Q1,Q1', and not that of the third NMOS Q3, and each of the second and fourth pull-down NMOS Q10,Q10' is connected to a first source/drain terminal of the second respective NMOS Q2,Q2', and not that of the fourth NMOS Q4.

Figure 13:
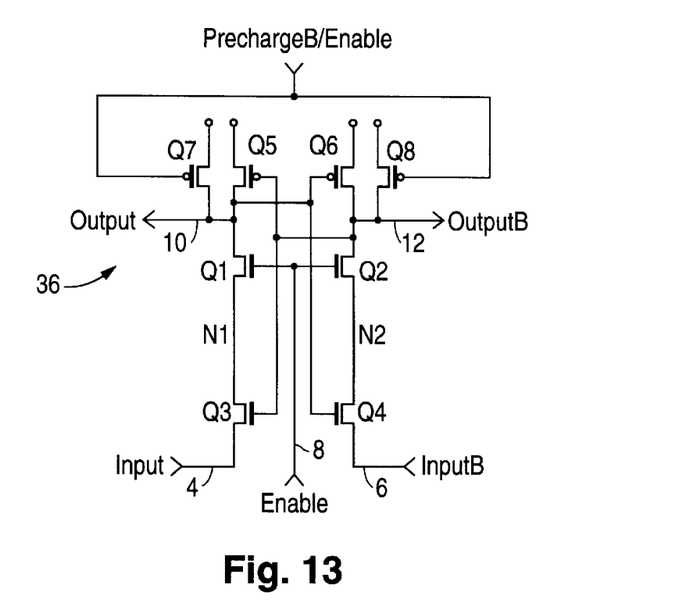
FIG. 13 is a schematic diagram of a sense amplifier according to a ninth embodiment of the present invention.

Referring to FIG. 13, a ninth embodiment 36 of the present invention includes all of the elements of the first embodiment 2. The difference is that instead of the second source/drain terminals of the first NMOS Q1 and second NMOS Q2 being connected to the respective first source/drain terminals of the third NMOS Q3 and fourth NMOS Q4, the first source/drain terminals of the first NMOS Q1 and second NMOS Q2 are respectively connected to the second source/drain terminals of the third NMOS Q3 and the fourth NMOS Q4. In this way, the first source/drain terminal of the third NMOS Q3 is connected to the first input 4, and the first source/drain terminal of the fourth NMOS Q4 is connected to the second input 6. Moreover, the second source/drain terminal of the first NMOS Q1 is connected to the first output 10, and the second source/drain terminal of the second NMOS Q2 is connected to the second output 12, rather than those of the third and fourth NMOS Q3,Q4 connecting with the respective outputs 10,12. The gate terminals of the first NMOS Q1 and the second NMOS Q2 are still connected to the first enabling signal 8 and the gate terminals of the third NMOS Q3 and the fourth NMOS Q4 are still connected respectively to the second output 12 and the first output 10, as in the first embodiment of FIG. 5A. Furthermore, the four PMOS Q5,Q6,Q7,Q8 are connected in the same way that those of the first embodiment of FIG. 5A are connected. In operation, before the control signal supplied on the enable line 8 reaches a high potential, the input signals on input lines 4 and 6 are passed through NMOS Q3 and Q4 (which are on) and are at the nodes N1 and N2. When Q1 and Q2 are switched on by the control signal, the side with the lower potential will pull down output 10 or 12.

Figure 14:
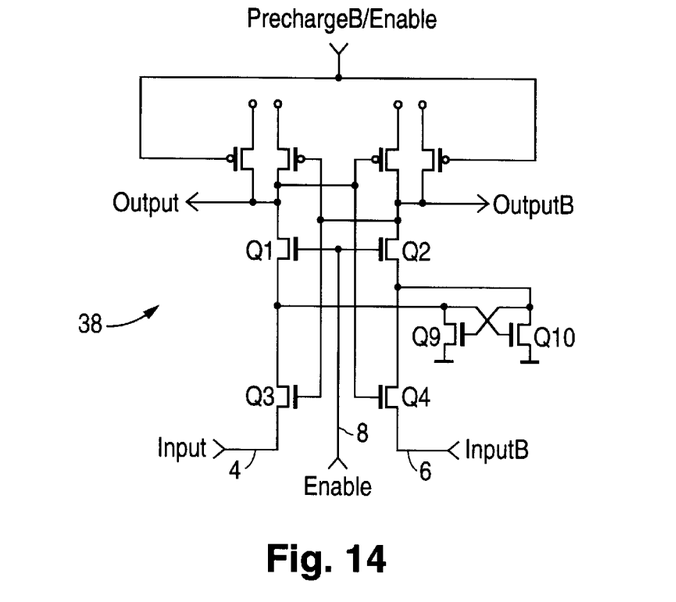
FIG. 14 is a schematic diagram of a sense amplifier according to a tenth embodiment of the present invention.

Referring to FIG. 14, a tenth embodiment 38 of the present invention includes all of the elements of the second embodiment. As in the ninth embodiment, the difference is that instead of the second source/drain terminals of the first NMOS Q1 and second NMOS Q2 being connected to the respective first source/drain terminals of the third NMOS Q3 and fourth NMOS Q4, the second source/drain terminals of the third NMOS Q3 and fourth NMOS Q4 are respectively connected to the first source/drain terminals of the first NMOS Q1 and the second NMOS Q2. In this way, the first source/drain terminal of the third NMOS Q3 is connected to the first input 4, and the first source/drain terminal of the fourth NMOS Q4 is connected to the second input 6. Moreover, the second source/drain terminal of the first NMOS Q1 is connected to the first output 10, and the second source/drain terminal of the second NMOS is connected to the second output 12. The gate terminals of the first NMOS Q1 and the second NMOS Q2 are still connected to the first enabling signal 8 and the gate terminals of the third NMOS Q3 and the fourth NMOS Q4 are still connected respectively to the second output 12 and the first output 10, as in the second embodiment of FIG. 6. Furthermore, the four PMOS Q5,Q6,Q7,Q8 are connected in the same way that those of the second embodiment of FIG. 6 are connected. In operation, similar to the embodiment shown in FIG. 13, the input signals on input lines 4 and 6 are passed through NMOS Q3 and Q4 before the control signal on the enabling line 8 reaches a high potential. Moreover, with transistors Q9 and Q10 coupled to the second source drain terminals of Q3 and Q4, and if the voltage of the input signals exceed $V_{THN}$ of Q9 and Q10, then the cross-coupling pull-down effect of transistors Q9 and Q10 can begin even before the control signal reaches a high potential.

Figure 15:
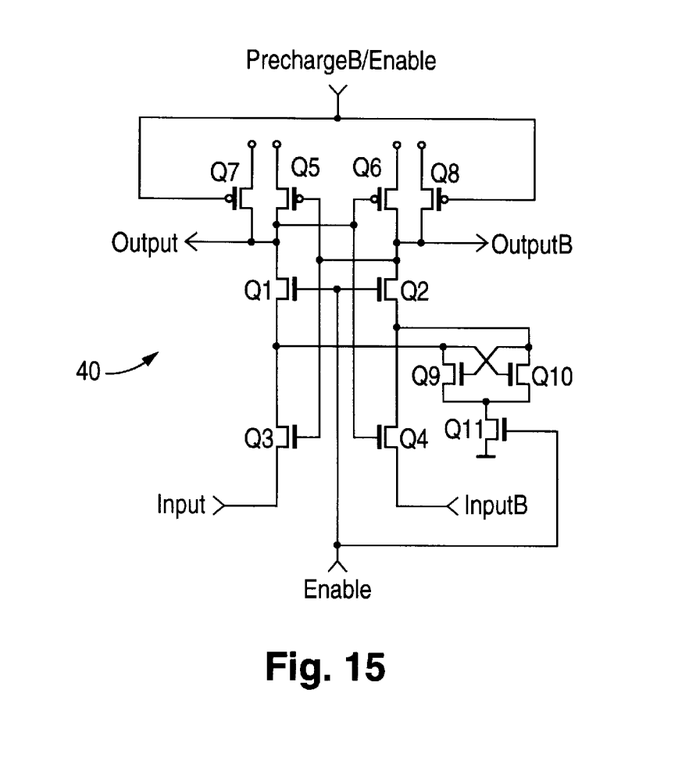
FIG. 15 is a schematic diagram of a sense amplifier according to a eleventh embodiment of the present invention.

Referring to FIG. 15, an eleventh embodiment 40 of the present invention includes all of the elements of the third embodiment 26. The difference between the eleventh embodiment 40 and the third embodiment 26 is that instead of the second source/drain terminals of the first NMOS Q1 and second NMOS Q2 being connected to the respective first source/drain terminals of the third NMOS Q3 and fourth NMOS Q4, the second source/drain terminals of the third NMOS Q3 and fourth NMOS Q4 are respectively connected to the first source/drain terminals of the first NMOS Q1 and the second NMOS Q2. In this way, the first source/drain terminal of the third NMOS is connected to the first input 4, and the first source/drain terminal of the fourth NMOS Q4 is connected to the second input 6. Moreover, the second source/drain terminal of the first NMOS Q1 is connected to the first output 10, and the second source/drain terminal of the second NMOS is connected to the second output 12. The gate terminals of the first NMOS Q1 and the second NMOS Q2 are still connected to the first enabling signal 8 and the gate terminals of the third NMOS Q3 and the fourth NMOS Q4 are still connected respectively to the second output 12 and the first output 10, as in the third embodiment of FIG. 7. Furthermore, the four PMOS Q5,Q6,Q7,Q8 transistors are connected in the same way that those of the third embodiment of FIG. 7 are connected.

Each of the eleven embodiments of the latch-sense amplifier of the present invention described above functions to sense and amplify a low level differential small swing input signal. In each embodiment, the enabling signal switches from low to high when a potential difference appears between the first input 4 and the second input 6. While the enabling signal is low, the first NMOS Q1 and the second NMOS Q2 are off such that no appreciable current flows through their channels between their two source/drain terminals. Also, the third PMOS Q7 and the fourth PMOS Q8 are turned on such that the first output 10 and the second output 12 are connected each to a power source 18,20. When the enabling signal goes high after the potential difference between the first input 4 and the second input 6 reaches a threshold, the first NMOS Q1 and the second NMOS Q2 turn on and connect the first input 4 and the second input 6 to the latch, and particularly to the third NMOS and the fourth NMOS, respectively. At the same time, the third PMOS Q3 and the fourth PMOS Q4 turn off and disconnect the first output 10 and the second output 12 from their respective power sources 18,20.

The first output 10 and second output 12 begin to discharge, but the first output 10 discharges faster than the second output 12 because the potential of the first input 4 is lower than that of the second input 6. Thus, in a short time, the first output goes low enough that the fourth NMOS Q4 turns off and the second PMOS 16 turns on, disconnecting the second output 12 from the second input 6 and connecting the second output 12 to the second power source 16, respectively. Thus, the first output 10 discharges to low level and the second output 12 remains at high level. As a result, a low level differential small swing input signal is amplified to an output differential of nearly the potential difference between the power source and ground.

What is claimed is:

1. A sense amplifier, comprising:
   a) a first input signal line and a second input signal line for receiving a first and a second input signal, respectively, said first and second input signals forming a differential input signal pair;
   b) a first transistor of a first conductivity type having a first and a third spaced apart terminals, and a second terminal for controlling the flow of current between the first and the third terminals, said first terminal electrically coupled to the first input signal line for receiving said first input signal;
   c) a second transistor of said first conductivity type having a first and a third spaced apart terminals, and a second terminal for controlling the flow of current between the first and the third terminals, said first terminal electrically coupled to the second input signal line for receiving said second input signal;
   d) said third terminal of said second transistor electrically connected to said second terminal of said first transistor and forming a first output;
   e) said third terminal of said first transistor electrically coupled connected to said second terminal of said second transistor and forming a second output;
   f) said first and second outputs for supplying an output signal and its inverse;
   g) a first switching circuit for connecting said third terminal of said first and second transistors to a first voltage source; and
   h) a second switching circuit for connecting said third terminal of said first and second transistors to said first voltage source;
   wherein the first output switches from a high level to a low level and the second output remains at said high level, when the input signal pair reaches a threshold differential, wherein the first switching circuit includes
   a third transistor of a second conductivity type having a first and a third spaced apart terminals, and a second terminal for controlling the flow of current between the first and the third terminals, said first terminal of said third transistor connected to said third terminal of said first transistor, said third terminal of said third transistor connected to said first voltage source, said second terminal of said third transistor for receiving a control signal; and
   a fourth transistor of said second conductivity type having a first and a third spaced apart terminals, and a second terminal for controlling the flow of current between the first and the third terminals, said first terminal of said fourth transistor connected to said third terminal of said second transistor, said third terminal of said fourth transistor connected to said first voltage source, said second terminal of said fourth transistor for receiving said control signal;
   and wherein the second switching circuit includes
   a fifth transistor of said second conductivity type having a first and a third spaced apart terminals, and a second terminal for controlling the flow of current between the first and the third terminals, said first terminal of said fifth transistor connected to said third terminal of said first transistor, said third terminal of said fifth transistor connected directly to said first voltage source, said second terminal of said fifth transistor connected to said third terminal of said second transistor, and
   a sixth transistor of said second conductivity type having a first and a third spaced apart terminals, and a second terminal for controlling the flow of current between the first and the third terminals, said first terminal of said sixth transistor connected to said third terminal of said second transistor, said third terminal of said sixth transistor connected directly to said first voltage source, said second terminal of said sixth transistor connected to said third terminal of said first transistor.

2. A sense amplifier, comprising:
   a) a first input signal line and a second input signal line for receiving a first and a second input signal, respectively, said first and second input signals forming a differential input signal pair;
   b) a first transistor of a first conductivity type having a first and a third spaced apart terminals, and a second terminal for controlling the flow of current between the first and the third terminals, said first terminal electrically coupled to the first input signal line for receiving said first input signal;
   c) a second transistor of said first conductivity type having a first and a third spaced apart terminals, and a second terminal for controlling the flow of current between the first and the third terminals, said first terminal electrically coupled to the second input signal line for receiving said second input signal;

d) said third terminal of said second transistor electrically connected to said second terminal of said first transistor and forming a first output;

e) said third terminal of said first transistor electrically coupled connected to said second terminal of said second transistor and forming a second output;

f) said first and second outputs for supplying an output signal and its inverse;

g) a first switching circuit for connecting said third terminal of said first and second transistors to a first voltage source;

h) a second switching circuit for connecting said third terminal of said first and second transistors to said first voltage source; and a third switching circuit for connecting said first terminal of said first transistor to said first input signal line, and for connecting said first terminal of said second transistor to said second input signal line, wherein the first output switches from a high level to a low level and the second output remains at said high level, when the input signal pair reaches a threshold differential.

3. The amplifier of claim 2, wherein said third switching circuit comprises:

a third transistor of said first conductivity type having a first and a third spaced apart terminals, and a second terminal for controlling the flow of current between the first and the third terminals, said first terminal of said third transistor connected to said first input signal line, said third terminal of said third transistor connected to said first terminal of said first transistor, said second terminal of said third transistor for receiving a control signal; and a fourth transistor of said first conductivity type having a first and a third spaced apart terminals, and a second terminal for controlling the flow of current between the first and the third terminals, said first terminal of said fourth transistor connected to said second input signal line, said third terminal of said fourth transistor connected to said first terminal of said second transistor, said second terminal of said fourth transistor connected to said second terminal of said third transistor.

4. The amplifier of claim 3, further comprising:

a fifth transistor of said first conductivity type having a first and a third spaced apart terminals, and a second terminal for controlling the flow of current between the first and the third terminals, said first terminal of said fifth transistor connected to a second voltage source, said third terminal of said fifth transistor connected to said first terminal of said first transistor, said second terminal of said fifth transistor connected to said second terminals of said third and fourth transistors; and a sixth transistor of said first conductivity type having a first and a third spaced apart terminals, and a second terminal for controlling the flow of current between the first and the third terminals, said first terminal of said sixth transistor connected to said second voltage source, said third terminal of said sixth transistor connected to said first terminal of said second transistor, said second terminal of said sixth transistor connected to said second terminal of said fifth transistor.

5. The amplifier of claim 3, further comprising:

a fifth transistor of said first conductivity type having a first and a third spaced apart terminals, and a second terminal for controlling the flow of current between the first and the third terminals, said third terminal of said fifth transistor connected to said first terminal of said first transistor, said second terminal of said fifth transistor connected to said first terminal of said second transistor;

a sixth transistor of said first conductivity type having a first and a third spaced apart terminals, and a second terminal for controlling the flow of current between the first and the third terminals, said third terminal of said sixth transistor connected to said first terminal of said second transistor, said second terminal of said sixth transistor connected to said first terminal of said first transistor; and a seventh transistor of said first conductivity type having a first and a third spaced apart terminals, and a second terminal for controlling the flow of current between the first and the third terminals, said first terminal of said fifteenth transistor connected to a second voltage source, said third terminal of said seventh transistor connected to both said first terminal of said fifth transistor and said first terminal of said sixth transistor, said second terminal of said seventh transistor connected to said second terminals of said third and fourth transistors.

6. The amplifier of claim 3, further comprising:

a fifth transistor of said first conductivity type having a first and a third spaced apart terminals, and a second terminal for controlling the flow of current between the first and the third terminals, said third terminal of said fifth transistor connected to said first terminal of said third transistor, said second terminal of said fifth transistor connected to said first terminal of said fourth transistor;

a sixth transistor of said first conductivity type having a first and a third spaced apart terminals, and a second terminal for controlling the flow of current between the first and the third terminals, said third terminal of said sixth transistor connected to said first terminal of said fourth transistor, said second terminal of said sixth transistor connected to said first terminal of said third transistor; and a seventh transistor of said first conductivity type having a first and a third spaced apart terminals, and a second terminal for controlling the flow of current between the first and the third terminals, said first terminal of said seventh transistor connected to a second voltage source, said third terminal of said seventh transistor connected to both said first terminal of said fifth transistor and said first terminal of said sixth transistor, said second terminal of said seventh transistor connected to said second terminals of said third and fourth transistors.

7. A sense amplifier, comprising:

a) a first input signal line and a second input signal line for receiving a first and a second input signal, Respectively, said first and second input signals forming a differential input signal pair;

b) a first transistor of a first conductivity type having a first and a third spaced apart terminals, and a second terminal for controlling the flow of current between the first and the third terminals, said first terminal electrically coupled to the first input signal line for receiving said first input signal;

c) a second transistor of said first conductivity type having a first and a third spaced apart terminals, and a second terminal for controlling the flow of current between the first and the third terminals, said first terminal electrically coupled to the second input signal line for receiving said second input signal;

d) said third terminal of said second transistor electrically connected to said second terminal of said first transistor and forming a first output;

e) said third terminal of said first transistor electrically coupled connected to said second terminal of said second transistor and forming a second output;

f) said first and second outputs for supplying an output signal and its inverse;

g) a first switching circuit for connecting said third terminal of said first and second transistors to a first voltage source;

h) a second switching circuit for connecting said third terminal of said first and second transistors to said first voltage source; and a third input signal line and a fourth input signal line for receiving a third and a fourth input signal, respectively, said third and fourth input signals forming another differential input signal pair, said first terminal of said first transistor electrically coupled to the third input signal line for receiving said third input signal, said first terminal of said second transistor electrically coupled to the fourth input signal line for receiving said fourth input signal, wherein the first output switches from a high level to a low level and the second output remains at said high level, when the input signal pair reaches a threshold differential.

8. The amplifier of claim 7, further comprising:

a third transistor of said first conductivity type having a first and a third spaced apart terminals, and a second terminal for controlling the flow of current between the first and the third terminals, said first terminal of said third transistor connected to said third input signal line, said third terminal of said third transistor connected to said first terminal of said first transistor, said second terminal of said third transistor for receiving a first control signal; and a fourth transistor of said first conductivity type having a first and a third spaced apart terminals, and a second terminal for controlling the flow of current between the first and the third terminals, said first terminal of said fourth transistor connected to said fourth input signal line, said third terminal of said fourth transistor connected to said first terminal of said second transistor, said second terminal of said fourth transistor connected to said second terminal of said third transistor.

9. The amplifier of claim 8, further comprising:

a fifth transistor of said first conductivity type having a first and a third spaced apart terminals, and a second terminal for controlling the flow of current between the first and the third terminals, said first terminal of said fifth transistor connected to said first input signal line, said third terminal of said fifth transistor connected to said first terminal of said first transistor, said second terminal of said fifth transistor for receiving a second control signal; and a sixth transistor of said first conductivity type having a first and a third spaced apart terminals, and a second terminal for controlling the flow of current between the first and the third terminals, said first terminal of said sixth transistor connected to said second input signal line, said third terminal of said sixth transistor connected to said first terminal of said second transistor, said second terminal of said sixth transistor connected to said second terminal of said fifth transistor.

10. The amplifier of claim 9, further comprising:

a seventh transistor of said first conductivity type having a first and a third spaced apart terminals, and a second terminal for controlling the flow of current between the first and the third terminals, said first terminal of said seventh transistor connected to second voltage source, said third terminal of said seventh transistor connected to said first terminal of said first transistor, said second terminal of said seventh transistor connected to said second terminals of said third and fourth transistors; and a eighth transistor of said first conductivity type having a first and a third spaced apart terminals, and a second terminal for controlling the flow of current between the first and the third terminals, said first terminal of said eighth transistor connected to said second voltage source, said third terminal of said eighth transistor connected to said first terminal of said second transistor, said second terminal of said eighth transistor connected to said second terminal of said seventh transistor.

11. The amplifier of claim 9, further comprising:

a seventh transistor of said first conductivity type having a first and a third spaced apart terminals, and a second terminal for controlling the flow of current between the first and the third terminals, said third terminal of said seventh transistor connected to said first terminal of said first transistor, said second terminal of said seventh transistor connected to said first terminal of said second transistor;

an eighth transistor of said first conductivity type having a first and a third spaced apart terminals, and a second terminal for controlling the flow of current between the first and the third terminals, said third terminal of said eighth transistor connected to said first terminal of said second transistor, said second terminal of said eighth transistor connected to said first terminal of said first transistor; and a ninth transistor of said first conductivity type having a first and a third spaced apart terminals, and a second terminal for controlling the flow of current between the first and the third terminals, said first terminal of said ninth transistor connected to a second voltage source, said third terminal of said ninth transistor connected to said first terminals of said seventh and eighth transistors, said second terminal of said ninth transistor connected to said second terminals of said third and fourth transistors.

12. The amplifier of claim 9, further comprising:

a seventh transistor of said first conductivity type having a first and a third spaced apart terminals, and a second terminal for controlling the flow of current between the first and the third terminals, said third terminal of said seventh transistor connected to said first terminal of said third transistor, said second terminal of said seventh transistor connected to said first terminal of said fourth transistor;

an eighth transistor of said first conductivity type having a first and a third spaced apart terminals, and a second terminal for controlling the flow of current between the first and the third terminals, said third terminal of said eighth transistor connected to said first terminal of said fourth transistor, said second terminal of said eighth transistor connected to said first terminal of said third transistor; and a ninth transistor of said first conductivity type having a first and a third spaced apart terminals, and a second terminal for controlling the flow of current between the first and the third terminals, said first terminal of said ninth transistor connected to a second voltage source, said third terminal of said ninth transistor connected to said first terminals of said seventh and eighth transistors, said second terminal of said ninth transistor connected to said second terminals of said third and fourth transistors.

13. A sense amplifier, comprising:
a) a first input signal line and a second input signal line for receiving a first and a second input signal, respectively, said first and second input signals forming a differential input signal pair;
b) a first transistor of a first conductivity type having a first and a third spaced apart terminals, and a second terminal for controlling the flow of current between the first and the third terminals, said first terminal electrically coupled to the first input signal line for receiving said first input signal;
c) a second transistor of said first conductivity type having a first and a third spaced apart terminals, and a second terminal for controlling the flow of current between the first and the third terminals, said first terminal electrically coupled to the second input signal line for receiving said second input signal;
d) a third transistor of said first conductivity type having a first and a third spaced apart terminals, and a second terminal for controlling the flow of current between the first and the third terminals, said first terminal of said third transistor connected to said third terminal of said first transistor, said second terminal of said third transistor connected to a first control signal;
e) a fourth transistor of said first conductivity type having a first and a third spaced apart terminals, and a second terminal for controlling the flow of current between the first and the third terminals, said first terminal of said fourth transistor connected to said third terminal of said second transistor, said second terminal of said fourth transistor connected to said second control signal;
f) said third terminal of said fourth transistor electrically connected to said second terminal of said first transistor and forming a first output;
e) said third terminal of said third transistor electrically coupled connected to said second terminal of said second transistor and forming a second output;
f) said first and second outputs for supplying an output signal and its inverse;
g) a first switching circuit for connecting said third terminal of said third and fourth transistors to a first voltage source; and
h) a second switching circuit for connecting said third terminal of said third and fourth transistors to said first voltage source;
wherein the first output switches from a high level to a low level and the second output remains at said high level, when the input signal pair reaches a threshold differential.

14. The amplifier of claim, 13, wherein the first switching circuit includes a fifth transistor of a second conductivity type having a first and a third spaced apart terminals, and a second terminal for controlling the flow of current between the first and the third terminals, said first terminal of said fifth transistor connected to said third terminal of said third transistor, said third terminal of said fifth transistor connected to said first voltage source, said second terminal of said fifth transistor connected to a second control signal, and an sixth transistor of said second conductivity type having a first and a third spaced apart terminals, and a second terminal for controlling the flow of current between the first and the third terminals, said first terminal of said sixth transistor connected to said third terminal of said fourth transistor, said third terminal of said sixth transistor connected to said first voltage source, said second terminal of said sixth transistor connected to said second control signal; and wherein the second switching circuit includes a seventh transistor of said second conductivity type having a first and a third spaced apart terminals, and a second terminal for controlling the flow of current between the first and the third terminals, said first terminal of said seventh transistor connected to said third terminal of said third transistor, said third terminal of said seventh transistor connected to said first voltage source, said second terminal of said seventh transistor connected to said third terminal of said fourth transistor, and an eighth transistor of said second conductivity type having a first and a third spaced apart terminals, and a second terminal for controlling the flow of current between the first and the third terminals, said first terminal of said eighth transistor connected to said third terminal of said fourth transistor, said third terminal of said eighth transistor connected to said first voltage source, said second terminal of said eighth transistor connected to said third terminal of said third transistor.

15. The amplifier of claim 13, further comprising
a fifth transistor of said first conductivity type having a first and a third spaced apart terminals, and a second terminal for controlling the flow of current between the first and the third terminals, said first terminal of said fifth transistor connected to a second voltage source, said third terminal of said fifth transistor connected to said first terminal of said third transistor, said second terminal of said fifth transistor connected to said first terminal of said fourth transistor; and a sixth transistor of said first conductivity type having a first and a third spaced apart terminals, and a second terminal for controlling the flow of current between the first and the third terminals, said first terminal of said sixth transistor connected to said second voltage source, said third terminal of said sixth transistor connected to said first terminal of said fourth transistor, said second terminal of said sixth transistor connected to said first terminal of said third transistor.

16. The amplifier of claim 13, further comprising:
a fifth transistor of said first conductivity type having a first and a third spaced apart terminals, and a second terminal for controlling the flow of current between the first and the third terminals, said third terminal of said fifth transistor connected to said first terminal of said third transistor, said second terminal of said fifth transistor connected to said first terminal of said fourth transistor;

a sixth transistor of said first conductivity type having a first and a third spaced apart terminals, and a second terminal for controlling the flow of current between the first and the third terminals, said third terminal of said sixth transistor connected to said first terminal of said fourth transistor, said second terminal of said sixth transistor connected to said first terminal of said third transistor; and an seventh transistor of said first conductivity type having a first and a third spaced apart terminals, and a second terminal for controlling the flow of current between the first and the third terminals, said third terminal of said seventh transistor connected to said first terminals of said fifth and sixth transistors, said first terminal of said seventh transistor connected to a second voltage source, said second terminal of said seventh transistor connected to said second terminals of said third and fourth transistors.

17. The amplifier of claim 1, further comprising a third switching circuit for connecting said first terminal of said first transistor to said first input signal line, and for connecting said first terminal of said second transistor to said second input signal line.

18. The amplifier of claim 11, wherein said third switching circuit comprises:

a third transistor of said first conductivity type having a first and a third spaced apart terminals, and a second terminal for controlling the flow of current between the first and the third terminals, said first terminal of said third transistor connected to said first input signal line, said third terminal of said third transistor connected to said first terminal of said first transistor, said second terminal of said third transistor for receiving a control signal; and a fourth transistor of said first conductivity type having a first and a third spaced apart terminals, and a second terminal for controlling the flow of current between the first and the third terminals, said first terminal of said fourth transistor connected to said second input signal line, said third terminal of said fourth transistor connected to said first terminal of said second transistor, said second terminal of said fourth transistor connected to said second terminal of said third transistor.

19. The amplifier of claim 18, further comprising:

a fifth transistor of said first conductivity type having a first and a third spaced apart terminals, and a second terminal for controlling the flow of current between the first and the third terminals, said first terminal of said fifth transistor connected to a second voltage source, said third terminal of said fifth transistor connected to said first terminal of said first transistor, said second terminal of said fifth transistor connected to said second terminals of said third and fourth transistors; and a sixth transistor of said first conductivity type having a first and a third spaced apart terminals, and a second terminal for controlling the flow of current between the first and the third terminals, said first terminal of said sixth transistor connected to said second voltage source, said third terminal of said sixth transistor connected to said first terminal of said second transistor, said second terminal of said sixth transistor connected to said second terminal of said fifth transistor.

20. The amplifier of claim 18, further comprising:

a fifth transistor of said first conductivity type having a first and a third spaced apart terminals, and a second terminal for controlling the flow of current between the first and the third terminals, said third terminal of said fifth transistor connected to said first terminal of said first transistor, said second terminal of said fifth transistor connected to said first terminal of said second transistor;

a sixth transistor of said first conductivity type having a first and a third spaced apart terminals, and a second terminal for controlling the flow of current between the first and the third terminals, said third terminal of said sixth transistor connected to said first terminal of said second transistor, said second terminal of said sixth transistor connected to said first terminal of said first transistor; and a seventh transistor of said first conductivity type having a first and a third spaced apart terminals, and a second terminal for controlling the flow of current between the first and the third terminals, said first terminal of said fifteenth transistor connected to a second voltage source, said third terminal of said seventh transistor connected to both said first terminal of said fifth transistor and said first terminal of said sixth transistor, said second terminal of said seventh transistor connected to said second terminals of said third and fourth transistors.

21. The amplifier of claim, 18, further comprising:

a fifth transistor of said first conductivity type having a first and a third spaced apart terminals, and a second terminal for controlling the flow of current between the first and the third terminals, said third terminal of said fifth transistor connected to said first terminal of said third transistor, said second terminal of said fifth transistor connected to said first terminal of said fourth transistor;

a sixth transistor of said first conductivity type having a first and a third spaced apart terminals, and a second terminal for controlling the flow of current between the first and the third terminals, said third terminal of said sixth transistor connected to said first terminal of said fourth transistor, said second terminal of said sixth transistor connected to said first terminal of said third transistor; and a seventh transistor of said first conductivity type having a first and a third spaced apart terminals, and a second terminal for controlling the flow of current between the first and the third terminals, said first terminal of said seventh transistor connected to a second voltage source, said third terminal of said seventh transistor connected to both said first terminal of said fifth transistor and said first terminal of said sixth transistor, said second terminal of said seventh transistor connected to said second terminals of said third and fourth transistors.

22. A sense amplifier, comprising:

a) a first input signal line and a second input signal line for receiving a first and a second input signal, respectively, said first and second input signals forming a differential input signal pair;

b) a first transistor of a first conductivity type having a first and a third spaced apart terminals, and a second terminal for controlling the flow of current between the first and the third terminals, said first terminal electrically coupled to the first input signal line for receiving said first input signal;

c) a second transistor of said first conductivity type having a first and a third spaced apart terminals, and a second terminal for controlling the flow of current between the first and the third terminals, said first terminal electrically coupled to the second input signal line for receiving said second input signal;

d) said third terminal of said second transistor electrically connected to said second terminal of said first transistor and forming a first output;

e) said third terminal of said first transistor electrically coupled connected to said second terminal of said second transistor and forming a second output;

f) said first and second outputs for supplying an output signal and its inverse;

g) a first switching circuit for connecting said third terminal of said first and second transistors to a first voltage source; and h) a second switching circuit for connecting said third terminal of said first and second transistors to said first voltage source;

wherein the first output switches from a high level to a low level and the second output remains at said high level, when the input signal pair reaches a threshold differential, wherein the first switching circuit includes a third transistor of a second conductivity type having a first and a third spaced apart terminals, and a second terminal for controlling the flow of current between the first and the third terminals, said first terminal of said third transistor connected to said third terminal of said first transistor, said third terminal of said third transistor connected to said first voltage source, said second terminal of said third transistor for receiving a control signal; and a fourth transistor of said second conductivity type having a first and a third spaced apart terminals, and a second terminal for controlling the flow of current between the first and the third terminals, said first terminal of said fourth transistor connected to said third terminal of said second transistor, said third terminal of said fourth transistor connected to said first voltage source, said second terminal of said fourth transistor for receiving said control signal;

and wherein the second switching circuit includes a fifth transistor of said second conductivity type having a first and a third spaced apart terminals, and a second terminal for controlling the flow of current between the first and the third terminals, said first terminal of said fifth transistor connected to said third terminal of said first transistor, said third terminal of said fifth transistor connected to said first voltage source, said second terminal of said fifth transistor connected to said third terminal of said second transistor, and a sixth transistor of said second conductivity type having a first and a third spaced apart terminals, and a second terminal for controlling the flow of current between the first and the third terminals, said first terminal of said sixth transistor connected to said third terminal of said second transistor, said third terminal of said sixth transistor connected to said first voltage source, said second terminal of said sixth transistor connected to said third terminal of said first transistor; and further comprising a third input signal line and a fourth input signal line for receiving a third and a fourth input signal, respectively, said third and fourth input signals forming another differential input signal pair, said first terminal of said first transistor electrically coupled to the third input signal line for receiving said third input signal, said first terminal of said second transistor electrically coupled to the fourth input signal line for receiving said fourth input signal.

23. The amplifier of claim 22, further comprising:

a third transistor of said first conductivity type having a first and a third spaced apart terminals, and a second terminal for controlling the flow of current between the first and the third terminals, said first terminal of said third transistor connected to said third input signal line, said third terminal of said third transistor connected to said first terminal of said first transistor, said second terminal of said third transistor for receiving a first control signal; and a fourth transistor of said first conductivity type having a first and a third spaced apart terminals, and a second terminal for controlling the flow of current between the first and the third terminals, said first terminal of said fourth transistor connected to said fourth input signal line, said third terminal of said fourth transistor connected to said first terminal of said second transistor, said second terminal of said fourth transistor connected to said second terminal of said third transistor.

24. The amplifier of claim 23, further comprising:

a fifth transistor of said first conductivity type having a first and a third spaced apart terminals, and a second terminal for controlling the flow of current between the first and the third terminals, said first terminal of said fifth transistor connected to said first input signal line, said third terminal of said fifth transistor connected to said first terminal of said first transistor, said second terminal of said fifth transistor for receiving a second control signal; and a sixth transistor of said first conductivity type having a first and a third spaced apart terminals, and a second terminal for controlling the flow of current between the first and the third terminals, said first terminal of said sixth transistor connected to said second input signal line, said third terminal of said sixth transistor connected to said first terminal of said second transistor, said second terminal of said sixth transistor connected to said second terminal of said fifth transistor.

25. The amplifier of claim 24, further comprising:

a seventh transistor of said first conductivity type having a first and a third spaced apart terminals, and a second terminal for controlling the flow of current between the first and the third terminals, said first terminal of said seventh transistor connected to second voltage source, said third terminal of said seventh transistor connected to said first terminal of said first transistor, said second terminal of said seventh transistor connected to said second terminals of said third and fourth transistors; and a eighth transistor of said first conductivity type having a first and a third spaced apart terminals, and a second terminal for controlling the flow of current between the first and the third terminals, said first terminal of said eighth transistor connected to said second voltage source, said third terminal of said eighth transistor connected to said first terminal of said second transistor, said second terminal of said eighth transistor connected to said second terminal of said seventh transistor.

26. The amplifier of claim 24, further comprising:

a seventh transistor of said first conductivity type having a first and a third spaced apart terminals, and a second terminal for controlling the flow of current between the first and the third terminals, said third terminal of said seventh transistor connected to said first terminal of said first transistor, said second terminal of said seventh transistor connected to said first terminal of said second transistor;

an eighth transistor of said first conductivity type having a first and a third spaced apart terminals, and a second terminal for controlling the flow of current between the first and the third terminals, said third terminal of said eighth transistor connected to said first terminal of said second transistor, said second terminal of said eighth transistor connected to said first terminal of said first transistor; and a ninth transistor of said first conductivity type having a first and a third spaced apart terminals, and a second terminal for controlling the flow of current between the first and the third terminals, said first terminal of said ninth transistor connected to a second voltage source, said third terminal of said ninth transistor connected to said first terminals of said seventh and eighth transistors, said second terminal of said ninth transistor connected to said second terminals of said third and fourth transistors.

27. The amplifier of claim 24, further comprising:

a seventh transistor of said first conductivity type having a first and a third spaced apart terminals, and a second terminal for controlling the flow of current between the first and the third terminals, said third terminal of said seventh transistor connected to said first terminal of said third transistor, said second terminal of said seventh transistor connected to said first terminal of said fourth transistor;

an eighth transistor of said first conductivity type having a first and a third spaced apart terminals, and a second terminal for controlling the flow of current between the first and the third terminals, said third terminal of said eighth transistor connected to said first terminal of said fourth transistor, said second terminal of said eighth transistor connected to said first terminal of said third transistor; and a ninth transistor of said first conductivity type having a first and a third spaced apart terminals, and a second terminal for controlling the flow of current between the first and the third terminals, said first terminal of said ninth transistor connected to a second voltage source, said third terminal of said ninth transistor connected to said first terminals of said seventh and eighth transistors, said second terminal of said ninth transistor connected to said second terminals of said third and fourth transistors.

28. A sense amplifier, comprising:

a) a first input signal line and a second input signal line for receiving a first and a second input signal, respectively, said first and second input signals forming a differential input signal pair;

b) a first transistor of a first conductivity type having a first and a third spaced apart terminals, and a second terminal for controlling the flow of current between the first and the third terminals, said first terminal electrically coupled to the first input signal line for receiving said first input signal;

c) a second transistor of said first conductivity type having a first and a third spaced apart terminals, and a second terminal for controlling the flow of current between the first and the third terminals, said first terminal electrically coupled to the second input signal line for receiving said second input signal;

d) said third terminal of said second transistor electrically connected to said second terminal of said first transistor and forming a first output;

e) said third terminal of said first transistor electrically coupled connected to said second terminal of said second transistor and forming a second output;

f) said first and second outputs for supplying an output signal and its inverse;

g) a first switching circuit for connecting said third terminal of said first and second transistors to a first voltage source; and h) a second switching circuit for connecting said third terminal of said first and second transistors to said first voltage source;

wherein the first output switches from a high level to a low level and the second output remains at said high level, when the input signal pair reaches a threshold differential, wherein the first switching circuit includes a third transistor of a second conductivity type having a first and a third spaced apart terminals, and a second terminal for controlling the flow of current between the first and the third terminals, said first terminal of said third transistor connected to said third terminal of said first transistor, said third terminal of said third transistor connected to said first voltage source, said second terminal of said third transistor for receiving a control signal; and a fourth transistor of said second conductivity type having a first and a third spaced apart terminals, and a second terminal for controlling the flow of current between the first and the third terminals, said first terminal of said fourth transistor connected to said third terminal of said second transistor, said third terminal of said fourth transistor connected to said first voltage source, said second terminal of said fourth transistor for receiving said control signal;

and wherein the second switching circuit includes a fifth transistor of said second conductivity type having a first and a third spaced apart terminals, and a second terminal for controlling the flow of current between the first and the third terminals, said first terminal of said fifth transistor connected to said third terminal of said first transistor, said third terminal of said fifth transistor connected to said first voltage source, said second terminal of said fifth transistor connected to said third terminal of said second transistor, and a sixth transistor of said second conductivity type having a first and a third spaced apart terminals, and a second terminal for controlling the flow of current between the first and the third terminals, said first terminal of said sixth transistor connected to said third terminal of said second transistor, said third terminal of said sixth transistor connected to said first voltage source, said second terminal of said sixth transistor connected to said third terminal of said first transistor; and further comprising a third switching circuit for connecting said first terminal of said first transistor to said first input signal line, and for connecting said first terminal of said second transistor to said second input signal line, wherein said third switching circuit comprises:

a seventh transistor of said first conductivity type having a first and a third spaced apart terminals, and a second terminal for controlling the flow of current between the first and the third terminals, said first terminal of said seventh transistor connected to said first input signal line, said third terminal of said seventh transistor connected directly to said first terminal of said first transistor, said second terminal of said seventh transistor for receiving a control signal; and an eighth transistor of said first conductivity type having a first and a third spaced apart terminals, and a second terminal for controlling the flow of current between the first and the third terminals, said first terminal of said eighth transistor connected to said second input signal line, said third terminal of said eighth transistor connected directly to said first terminal of said second transistor, said second terminal of said eighth transistor connected to said second terminal of said seventh transistor.

29. The amplifier of claim 28, further comprising:

a ninth transistor of said first conductivity type having a first and a third spaced apart terminals, and a second terminal for controlling the flow of current between the first and the third terminals, said first terminal of said ninth transistor connected to a second voltage source, said third terminal of said ninth transistor connected to said first terminal of said first transistor, said second terminal of said ninth transistor connected to said second terminals of said seventh and eighth transistors; and a tenth transistor of said first conductivity type having a first and a third spaced apart terminals, and a second terminal for controlling the flow of current between the first and the third terminals, said first terminal of said tenth transistor connected to said second voltage source, said third terminal of said tenth transistor connected to said first terminal of said second transistor, said second terminal of said tenth transistor connected to said second terminal of said ninth transistor.

30. The amplifier of claim 28, further comprising:

a ninth transistor of said first conductivity type having a first and a third spaced apart terminals, and a second terminal for controlling the flow of current between the first and the third terminals, said third terminal of said ninth transistor connected to said first terminal of said first transistor, said second terminal of said ninth transistor connected to said first terminal of said second transistor;

a tenth transistor of said first conductivity type having a first and a third spaced apart terminals, and a second terminal for controlling the flow of current between the first and the third terminals, said third terminal of said tenth transistor connected to said first terminal of said second transistor, said second terminal of said tenth transistor connected to said first terminal of said first transistor; and an eleventh transistor of said first conductivity type having a first and a third spaced apart terminals, and a second terminal for controlling the flow of current between the first and the third terminals, said first terminal of said eleventh transistor connected to a second voltage source, said third terminal of said eleventh transistor connected to both said first terminal of said ninth transistor and said first terminal of said tenth transistor, said second terminal of said eleventh transistor connected to said second terminals of said seventh and eighth transistors.

31. The amplifier of claim 28, further comprising:

a ninth transistor of said first conductivity type having a first and a third spaced apart terminals, and a second terminal for controlling the flow of current between the first and the third terminals, said third terminal of said ninth transistor connected to said first terminal of said third transistor, said second terminal of said ninth transistor connected to said first terminal of said eighth transistor;

a tenth transistor of said first conductivity type having a first and a third spaced apart terminals, and a second terminal for controlling the flow of current between the first and the third terminals, said third terminal of said tenth transistor connected to said first terminal of said eighth transistor, said second terminal of said tenth transistor connected to said first terminal of said seventh transistor; and an eleventh transistor of said first conductivity type having a first and a third spaced apart terminals, and a second terminal for controlling the flow of current between the first and the third terminals, said first terminal of said eleventh transistor connected to a second voltage source, said third terminal of said eleventh transistor connected to both said first terminal of said ninth transistor and said first terminal of said eighth transistor, said second terminal of said eleventh transistor connected to said second terminals of said seventh and eighth transistors.

* * * * *